United States Patent
Chen et al.

(10) Patent No.: US 11,828,901 B2
(45) Date of Patent: Nov. 28, 2023

(54) NUCLEAR MAGNETIC RESONANCE (NMR) FLUID SUBSTITUTION USING MACHINE LEARNING

(71) Applicant: Halliburton Energy Services, Inc., Houston, TX (US)

(72) Inventors: Songhua Chen, Houston, TX (US); Wei Shao, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 279 days.

(21) Appl. No.: 17/514,654

(22) Filed: Oct. 29, 2021

(65) Prior Publication Data

US 2023/0133700 A1  May 4, 2023

(51) Int. Cl.
*G01V 3/32* (2006.01)
*G01V 3/38* (2006.01)
(Continued)

(52) U.S. Cl.
CPC .............. *G01V 3/32* (2013.01); *G01N 24/081* (2013.01); *G01R 33/50* (2013.01); *G01V 3/38* (2013.01)

(58) Field of Classification Search
CPC .......... G01V 3/32; G01V 3/38; G01N 24/081; G01R 33/50
(Continued)

(56) References Cited

U.S. PATENT DOCUMENTS 4,291,271 A * 9/1981 Lauffer .................. G01R 33/44
324/303
9,891,179 B2  2/2018 Shao et al.
(Continued)

FOREIGN PATENT DOCUMENTS

| CN | 109443867 B | * | 8/2019 | ............. G01N 1/286 |
| WO | WO-2022225810 A1 | * | 10/2022 | ............. G01N 24/081 |
| WO | WO-2023075792 A1 | * | 5/2023 | ............. G01N 24/081 |

OTHER PUBLICATIONS

Mondal et al., Fluid substitution in NMR T2 distribution and resistivity independent saturation computation using synthetic capillary pressure data. Petroleum Research 8 (2023) 77-86. Mar. 5, 2022. (Year: 2022).*

(Continued)

*Primary Examiner* — Jermele M Hollington
*Assistant Examiner* — Sean Curtis
(74) *Attorney, Agent, or Firm* — John Wustenberg; C. Tumey Law Group PLLC

(57) ABSTRACT

System and methods for nuclear magnetic resonance (NMR) fluid substitution are provided. NMR logging measurements of a reservoir rock formation are acquired. Fluid zones within the reservoir rock formation are identified based on the acquired measurements. The fluid zones include water zones comprising water-saturated rock and at least one oil zone comprising rock saturated with multiphase fluids. Water zones having petrophysical characteristics matching those of the oil zone(s) within the formation are selected. NMR responses to multiphase fluids resulting from a displacement of water by hydrocarbon in the selected water zones are simulated. A synthetic dataset including NMR T2 distributions of multiphase fluids is generated based on the simulation. The synthetic dataset is used to train a machine learning (ML) model to substitute NMR T2 distributions of multiphase fluids with those of water. The trained ML model is applied to the NMR logging measurements acquired for the oil zone(s).

20 Claims, 6 Drawing Sheets

(51) Int. Cl.
  *G01R 33/50* (2006.01)
  *G01N 24/08* (2006.01)

(58) Field of Classification Search
  USPC .......................................................... 324/303
  See application file for complete search history.

(56) References Cited

U.S. PATENT DOCUMENTS

| | | | |
|---|---|---|---|
| 10,539,705 B2* | 1/2020 | Coman | G01V 3/32 |
| 10,858,936 B2* | 12/2020 | Chen | E21B 49/0875 |
| 11,092,714 B2* | 8/2021 | Li | G01V 3/32 |
| 2016/0230548 A1 | 8/2016 | Gzara et al. | |
| 2016/0320323 A1 | 11/2016 | Saidian et al. | |
| 2020/0102824 A1* | 4/2020 | Chen | G01V 3/38 |
| 2020/0158907 A1* | 5/2020 | Li | G01V 3/38 |
| 2020/0184359 A1 | 6/2020 | Hassan et al. | |
| 2021/0310307 A1 | 10/2021 | Panchal et al. | |
| 2022/0260746 A1* | 8/2022 | Al-Malki | G01V 3/38 |
| 2022/0341858 A1* | 10/2022 | Kesserwan | G01N 24/081 |
| 2023/0133700 A1* | 5/2023 | Chen | G01R 33/50 |
| | | | 323/303 |

OTHER PUBLICATIONS

Ravi, Vivek., Mixing laws and fluid substitution for interpretation of magnetic resonance measurements. Thesis Presented to the Faculty of the Graduate School of The University of Texas at Austin. Dec. 2016 (Year: 2016).*

Li et al., NMR Fluid Substitution—A New Method of Reconstructing T2 Distributions Under Primary Drainage and Imbibition Conditions. Petrophysics, vol. 62, No. 4 (Aug. 2021); pp. 362-378 (Year: 2021).*

Chen, S., R. Arro, C. Minetto, D. Georgi, and C. Liu, Methods for Computing SWI and BVI from NMR logs, Society of Petrophysicists and Well Log Analysts (SPWLA) 39th Annual Logging Symposium, May 26-29, 1998, pp. 1-10, Keystone, Colorado, USA.

Chen, S., Shao, W., and Balliet, R., New, Robust Multidimensional NMR Inversion Methods for Improving Fluid Typing and Rock Characterization, SPWLA 57th Annual Logging Symposium, Jun. 25-29, 2016, pp. 1-11, Reykjavik, Iceland.

Christensen, S. A., H. F. Thern, and O. Vejbck, NMR Fluid Substitution Method for Reservoir Characterization and Drilling Optimization in Low Porosity Chalk, SPWLA 56th Annual Logging Symposium, Jul. 18-22, 2015, pp. 1-23, Long Beach, California, USA.

Li, B., Kesserwan H., Jin, G., and Ma, S.M., NMR Fluid Substitution—A New Method of Reconstruction T2 Distributions Uber Primary Drainage and Imbibition Conditions, Petrophysics—The SPWLA Journal of Formation Evaluation and Reservoir Description, vol. 62 (4), pp. 362-378, 2021.

Medellin, D., Ravi, V.R., and Torres-Verdin, C., Pore-Size-Dependent Fluid Substitution Method for Magnetic Resonance Measurements, Geophysics, vol. 84, No. 1, 2019, Austin, Texas, USA.

Minh, C. C., V. Jain, R. Griffiths, and D. Maggs, NMR T2 Fluids Substitution, SPWLA 57th Annual Logging Symposium, Jun. 25-29, 2016, pp. 1-12, Reykjavik, Iceland.

International Search Report and Written Opinion for International Patent Application No. PCT/US2021/057338 dated Jul. 26, 2022.

* cited by examiner

NUCLEAR MAGNETIC RESONANCE (NMR) FLUID SUBSTITUTION USING MACHINE LEARNING

FIELD OF THE DISCLOSURE

The present disclosure relates generally to fluid substitution using nuclear magnetic resonance (NMR) measurements, and particularly to NMR fluid substitution using machine learning.

BACKGROUND

Nuclear magnetic resonance (NMR) logging tools have been used in the oil and gas industry to explore the subsurface based on the magnetic interactions with subsurface material. NMR logs, including longitudinal (T1) and transverse (T2) relaxation measurements, provide useful information about the quantities of fluids present within a subsurface rock formation, the properties of these fluids, and the sizes of the pores containing these fluids. The NMR T2 distribution in particular may be treated as a proxy for rock pore size distribution. It is the basis of many NMR logging interpretation models, for example, NMR pore tying models, NMR permeability models, etc. However, this assumption about NMR T2 distribution is valid only for water saturated rocks. For rocks saturated with multiphase fluids, i.e., water and hydrocarbon, their T2 distributions cannot be treated as an approximation of pore size distributions. Because the NMR response of oil is not related to pore geometries for water-wet rocks, the existence of hydrocarbon disturbs the T2 distributions and invalidates the assumption about the correlation between NMR distributions and pore size distributions. Consequently, many of NMR interpretation models are no longer applicable for rock formations with multiphase fluids. To use these NMR interpretation models correctly, a common practice is to replace the portions of a T2 distribution corresponding to a hydrocarbon response with T2 distributions corresponding to a water response. This practice is referred to as NMR fluid substitution.

DESCRIPTION OF ILLUSTRATIVE EMBODIMENTS

Figure 1:
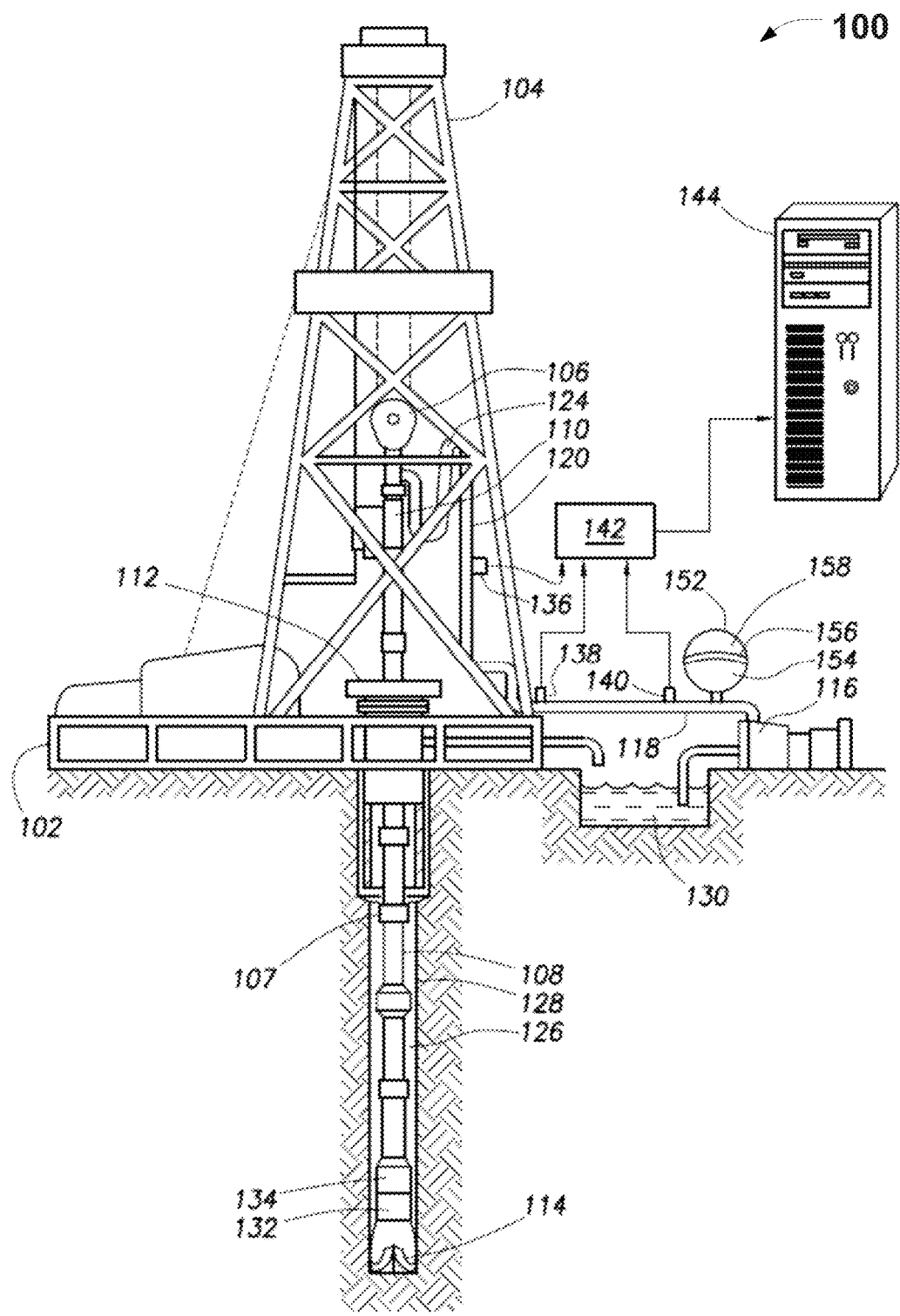
FIG. 1 is a diagram of an illustrative drilling system for performing downhole operations at a well site.

Embodiments of the present disclosure relate to nuclear magnetic resonance (NMR) fluid substitution using machine learning. While the present disclosure is described herein with reference to illustrative embodiments for particular applications, it should be understood that embodiments are not limited thereto. Other embodiments are possible, and modifications can be made to the embodiments within the spirit and scope of the teachings herein and additional fields in which the embodiments would be of significant utility. Further, when a particular feature, structure, or characteristic is described in connection with an embodiment, it is submitted that it is within the knowledge of one skilled in the relevant art to implement such feature, structure, or characteristic in connection with other embodiments whether or not explicitly described.

It would also be apparent to one of skill in the relevant art that the embodiments, as described herein, can be implemented in many different embodiments of software, hardware, firmware, and/or the entities illustrated in the figures. Any actual software code with the specialized control of hardware to implement embodiments is not limiting of the detailed description. Thus, the operational behavior of embodiments will be described with the understanding that modifications and variations of the embodiments are possible, given the level of detail presented herein. In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment.

As will be described in further detail below, embodiments of the present disclosure use machine learning (ML) for improved NMR fluid substitution. In one or more embodiments, an ML based NMR fluid substitution model may be trained to perform NMR fluid substitution based on NMR logging data. The NMR fluid substitution model according to the disclosed embodiments may be calibrated without requiring core and fluid analyses to be conducted as in conventional modeling approaches to NMR fluid substitution. In one or more embodiments, the ML model used for NMR fluid substitution may be a deep neural network that is trained to identify portions of the T2 distributions within NMR logging measurements corresponding to a hydrocarbon response and replace the identified portions with T2 distributions corresponding to a water response. The water response may be produced by "water zones" of a reservoir rock formation corresponding to areas of water-saturated rock. The hydrocarbon response may be produced by at least one "oil zone" of the formation in which the rock is saturated with hydrocarbons (e.g., oil and/or natural gas) or multiphase fluids (e.g., a mixture of water and hydrocarbon). The inputs for such an ML model may include, for example, mineralogy and lithology logging measurements acquired for the reservoir rock formation, the formation's total porosity and water saturation, and T2 distributions of the multiphase fluids. The output of the ML model may be NMR T2 distributions of 100 percent water saturation. Accordingly, the trained ML model may be applied to an oil zone of interest within a reservoir formation for predicting the T2 distributions of a corresponding water zone with 100 percent water saturation. It should be appreciated that the oil zone of interest may be in a different reservoir formation, which has similar petrophysical characteristics to the reservoir formation from which the mineralogy and lithology logging measurements used to train the ML model were acquired. The T2 distributions output by the ML model may be used to replace the T2 distributions of the oil zone, e.g., as represented in a petrophysical model generated for the reservoir rock formation. The petrophysical model may be used to determine rock properties (e.g., permeability, fluid properties, and pore size distribution) of the reservoir formation for purposes of well planning and production during hydrocarbon recovery operations.

Illustrative embodiments and related methodologies of the present disclosure are described below with reference to FIGS. 1-5 as they might be employed, for example, in a computer system for improved reservoir modeling and fluid typing applications during well planning and hydrocarbon recovery operations. An example of such a computer system is described with reference to FIG. 6. Other features and advantages of the disclosed embodiments will be or will become apparent to one of ordinary skill in the art upon examination of the following figures and detailed description. It is intended that all such additional features and advantages be included within the scope of the disclosed embodiments. Further, the illustrated figures are only exemplary and are not intended to assert or imply any limitation with respect to the environment, architecture, design, or process in which different embodiments may be implemented.

FIG. 1 is a diagram of an illustrative drilling system 100 for performing downhole operations at a well site. Examples of such downhole operations include, but are not limited to, drilling, completion, and stimulation operations for purposes of hydrocarbon exploration and production. As shown in FIG. 1, system 100 includes a drilling platform 102 located at the surface of a borehole or wellbore 126. Wellbore 126 is drilled into different layers of a subsurface rock formation using a drill string 108 that includes a string of drill pipes connected together by "tool" joints 107. Drilling platform 102 is equipped with a derrick 104 that supports a hoist 106. Hoist 106 suspends a top drive 110 that is used to lower drill string 108 through a wellhead 112 and rotate drill string 108 within wellbore 126. Connected to a distal end of drill string 108 is a bottom hole assembly (BHA), which includes a drill bit 114, an NMR logging tool 132, and a telemetry device 134. It should be appreciated that drill bit 114, NMR logging tool 132, and telemetry device 134 may be implemented as separate components within a housing of the BHA at the end of drill string 108. Although not shown in FIG. 1, it should also be appreciated that the BHA may include additional downhole tools, sensors, and drill string components for supporting various functions related to the drilling operations being conducted. Examples of such components include, but are not limited to, drill collars, stabilizers, reamers, and hole-openers.

Drilling of wellbore 126 occurs as drill bit 114 penetrates the subsurface formation while rotating at the end of drill string 108. Drill bit 114 may be rotated in conjunction with the rotation of drill string 108 by top drive 110. Additionally or alternatively, drill bit 114 may be rotated independently from the rest of drill string 108 by a downhole motor (not shown) positioned near drill bit 114. Although wellbore 126 is shown in FIG. 1 as a vertical wellbore, it should be appreciated that wellbore 126 may be drilled in a non-vertical, horizontal, or near-horizontal direction, e.g., as a deviated well drilled at angles approaching or at 90 degrees from vertical. Also, while FIG. 1 (and other figures described below) may depict an onshore operation, it should be appreciated that embodiments of the present disclosure are not intended to be limited thereto and that the disclosed techniques are equally well suited for offshore operations. Further, even though a figure may depict a cased hole, it should be appreciated that embodiments of the present disclosure are not intended to be limited thereto and that the disclosed techniques are equally well suited for open hole operations.

Drilling fluid may be pumped at high pressures and volumes by a mud pump 116 through a flow line 118, a stand pipe 120, a goose neck 124, top drive 110, and drill string 108 to emerge through nozzles or jets in drill bit 114. The drilling fluid emerging from drill bit 114 travels back up wellbore 126 via a channel or annulus formed between the exterior of drill string 108 and a wellbore wall 128. The drilling fluid then goes through a blowout preventer (not specifically shown) and into a mud pit 130 at the surface, where the fluid is cleaned and recirculated by mud pump 116 through drill string 108 and wellbore 126. The drilling fluid may be used for various purposes during the drilling operation including, but not limited to, cooling drill bit 114, carrying cuttings from the base of the bore to the surface, and balancing the hydrostatic pressure in the rock formations.

In one or more embodiments, NMR logging tool 132 may be used to collect NMR logging measurements as drill bit 114 extends wellbore 126 through different layers of the rock formation. NMR logging tool 132 in this example may be in the form of a drill collar located immediately before drill bit 114 at a distal end of the BHA. In one or more embodiments, NMR logging tool 132 may have a designated reference point or location relative to which the tool's current position within wellbore 126 and formation may be measured during the downhole operation. Such a tool reference point may correspond to, for example, the location of drill bit 114 at the distal end of the BHA. While only downhole tool 132 is shown in FIG. 1, it should be appreciated that the disclosed embodiments are not limited thereto and that additional downhole tools (e.g., sensors or other measurement devices) may be used. In some implementations, additional downhole tools included in the BHA of drill string 108 may be used to collect measurements of various drilling parameters, such as drill string position, orientation, weight-on-bit, borehole diameter, formation resistivity, etc., along with the NMR logging measurements collected by NMR logging tool 132.

In one or more embodiments, the measurements collected by NMR logging tool 132 (and other downhole tools) may be transmitted to the surface by telemetry device 134. Telemetry device 134 may be part of a communication and control subsystem of drill string 108. Telemetry device 134 may be communicatively coupled to NMR logging tool 132 for receiving NMR logging measurements. Telemetry device 134 may include an internal memory for storing the information received from NMR logging tool 132 and other downhole tools (not shown) to which it may be communicatively coupled. Telemetry device 134 may transmit the downhole information, including the NMR logging measurements received from NMR logging tool 132, to a computer 144 located at the surface of the well site. The information may be transmitted using any suitable communication channel (e.g., pressure pulses within the drilling fluid flowing in drill string 108, acoustic telemetry through the pipes of the drill string 108, electromagnetic telemetry, optical fibers embedded in the drill string 108, or any combination thereof). For example, drilling system 100 may employ mud pulse telemetry for transmitting downhole information collected by NMR logging tool 132 to the surface during the drilling operation. However, it should be appreciated that embodiments are not limited thereto and that any of various other types of data communication techniques may be used for sending the downhole information to the surface. Such techniques may include, for example and without limitation, wireless communication techniques and wireline or any other type of wired electrical communication techniques.

In the above mud pulse telemetry example, telemetry device 134 may encode the NMR logging measurements (and any other downhole information) using a data compression scheme and transmit the encoded data to the surface by modulating the flow of drilling fluid through drill string 108 to generate pressure pulses that propagate to the surface. The pressure pulses may be received at the surface by various transducers 136, 138 and 140, which convert the received pulses into electrical signals for a signal digitizer 142 (e.g., an analog to digital converter). While three transducers 136, 138 and 140 are shown in FIG. 1, greater or fewer numbers of transducers may be used as desired for a particular implementation. Digitizer 142 supplies a digital form of the pressure signals to computer 144.

In one or more embodiments, computer 144 may function as a control system of drilling rig 104 for monitoring and controlling downhole operations at the well site. Computer 144 may be implemented using any type of computing device having at least one processor and a memory. Computer 144 may decode and process the digital signals received from digitizer 142 using an appropriate decoding scheme. The resulting decoded telemetry data may be further analyzed and processed by computer 144 to display useful information to a well site operator. The processing performed by computer 144 may include performing the disclosed ML-based NMR fluid substitution techniques, as will be described in further detail below. The results of the NMR fluid substitution may be used, e.g., in conjunction with a petrophysical model of the underlying reservoir rock formation, to determine rock and fluid properties of the reservoir formation. The rock and fluid properties that are determined may then be used to make appropriate well planning decisions, e.g., for adjusting or optimizing a planned path of wellbore 126 being drilled through the formation to maximize hydrocarbon recovery from the wellbore and reservoir rock formation.

It should be appreciated that computer 144 may be located at the surface of the well site, e.g., near drilling rig 104A, or at a remote location from the well site. While not shown in FIG. 1, computer 144 may be communicatively coupled to one or more other computer systems via a communication network, e.g., a local area, medium area, or wide area network, such as the Internet. Such other computer systems may include remote computer systems located away from the well site for remotely monitoring and controlling well site operations via the communication network.

To reduce noise in the downhole data received at the surface, drilling system 100 may include a dampener or desurger 152 to reduce noise. Flow line 118 couples to a drilling fluid chamber 154 in desurger 152. A diaphragm or separation membrane 156 separates the drilling fluid chamber 154 from a gas chamber 158. Desurger 152 may include a gas chamber 158 filled with nitrogen at a predetermined percentage, e.g., approximately 50% to 75% of the operating pressure of the drilling fluid. The diaphragm 156 moves with variations in the drilling fluid pressure, enabling the gas chamber to expand and contract, thereby absorbing some of the pressure fluctuations.

In addition to transmitting information collected downhole to the surface, telemetry device 134 may receive information from the surface over one or more of the above-described communication channels. The information received from the surface may include, for example, signals for controlling the operation of the BHA or individual components thereof. Such control signals may be used, for example, to update operating parameters of the BHA for purposes of adjusting a planned trajectory or path of wellbore 126 through the formation during different stages of the drilling operation. In one or more embodiments, the control signals may be representative of automated instructions or commands input by a well site operator for making adjustments to the planned path or controlling various operational variables of the drilling operation as downhole conditions change over time. Examples of such operational variables may include, but are not limited to, weight on bit, drilling fluid flow through the drill pipe, the drill string rotational speed, and the density and viscosity of the drilling fluid.

Accordingly, computer 144 may provide an interface enabling the well site operator at the surface to receive indications of downhole operating conditions and adjust one or more of controllable parameters of the drilling operation accordingly. The interface may include a display for presenting relevant information, e.g., values of drilling parameters or operational variables, to the operator during the drilling operation as well as a user input device (e.g., a mouse, keyboard, touchscreen, etc.) for receiving input from the operator. As downhole operating conditions may continually change over the course of the operation, the operator may use the interface provided by computer 144 to react to such changes in real time by adjusting selected drilling parameters in order to increase and/or maintain drilling efficiency and thereby, optimize the drilling operation.

Figure 2:
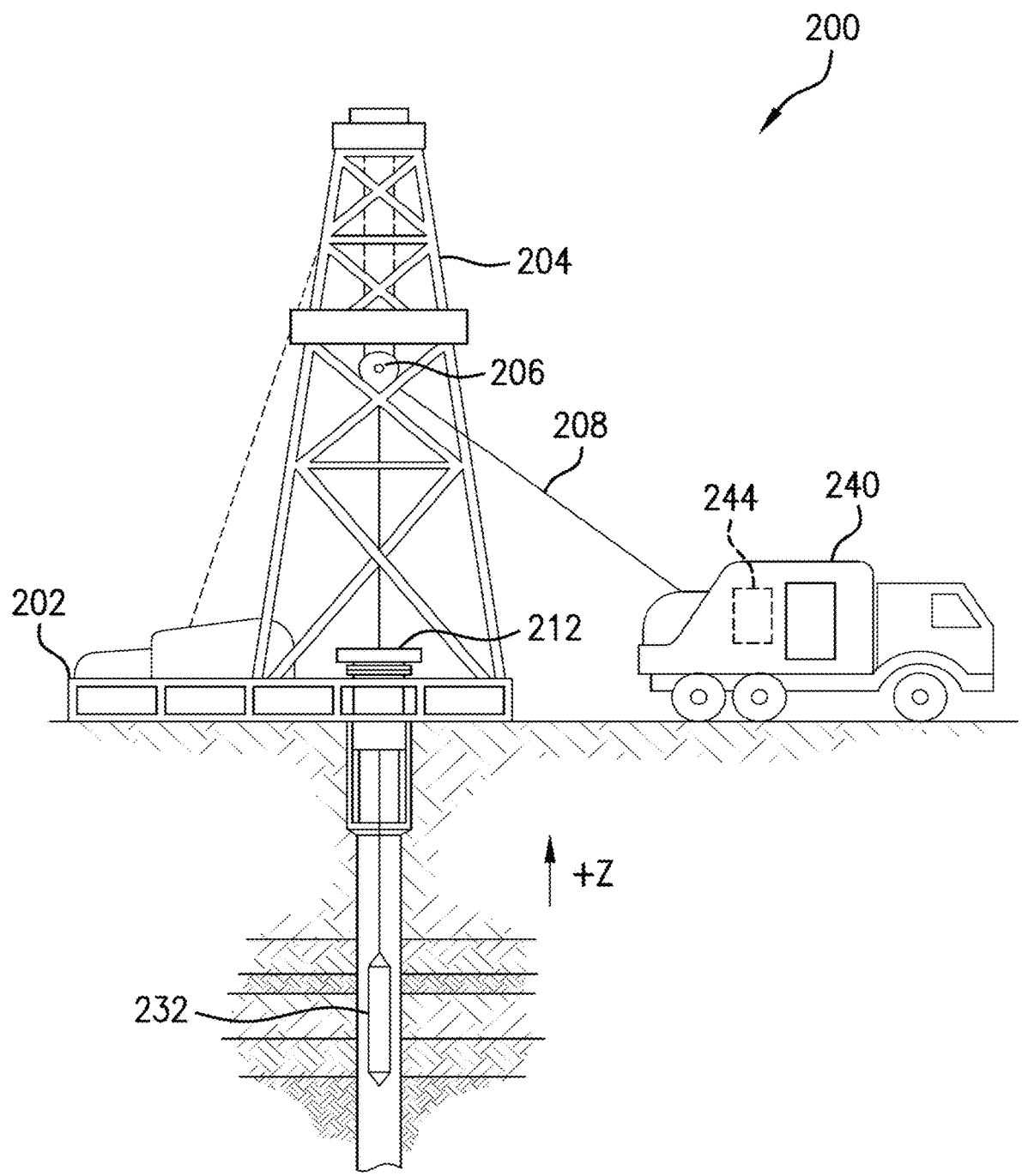
FIG. 2 is a diagram of an illustrative wireline logging system for collecting downhole nuclear magnetic resonance (NMR) measurements at a well site.

FIG. 2 is a diagram of an illustrative wireline logging system 200 for collecting downhole NMR measurements at a well site. As shown in FIG. 2, a drilling platform 202 is equipped with a derrick 204 that supports a hoist 206. Hoist 206 a cable 208 that is used to lower an NMR logging tool 232 through a wellhead 212 within the wellbore. In one or more embodiments, NMR logging tool 232 may be used as an alternative to NMR logging tool 132 of FIG. 1, as described above, for collecting NMR logging measurements from the wellbore. For example, at various times during a drilling operation, a drill string (e.g., drill string 108 of FIG. 1, as described above) may be removed from the wellbore and NMR logging tool 232 may be inserted for purposes of collecting NMR measurements from different areas of the surrounding formation at various depths or locations along the wellbore. NMR logging tool 232 in this example may be a logging sonde in the form of an acoustic probe suspended by a cable 141. Cable 141 may have conductors for transporting power to the sonde and telemetry from the sonde to the surface. NMR logging tool 232 may have pads and/or centralizing springs to maintain its position near the axis of the wellbore or wellbore wall as the tool is pulled uphole.

A logging facility 240 collects the NMR logging measurements from NMR logging tool 232. Logging facility 240 may include a computer 244 for processing and storing the logging measurements collected by NMR logging tool 232. Like computer 144 of FIG. 1, as described above, computer 244 may be implemented using any type of computing device having at least one processor and a memory. Also, like computer 144 of FIG. 1, computer 244 may be used to perform the ML-based NMR fluid substitution techniques disclosed herein, based on the NMR logging measurements collected at various depths along the wellbore.

In one or more embodiments, the NMR logging measurements collected by NMR logging tools 132 and 232 of FIGS. 1 and 2, respectively, may include the distributions of spin relaxation times (T1 and T2) as a function of depth or position in the wellbore. As will be described in further detail below with respect to FIG. 3, each of NMR logging tools 132 and 232 may include an arrangement of magnets and antennas for transmitting and receiving NMR data signals to and from the surround reservoir rock formation.

The NMR data signals may include, for example, pulse sequences transmitted through the surrounding formation to generate a series of so-called spin echoes, which can be measured by each tool. Transverse relaxation time (T2) may be measured through the decay of excited magnetization in the formation while longitudinal relaxation time (T1) may be measured by the buildup of magnetization.

Figure 3:
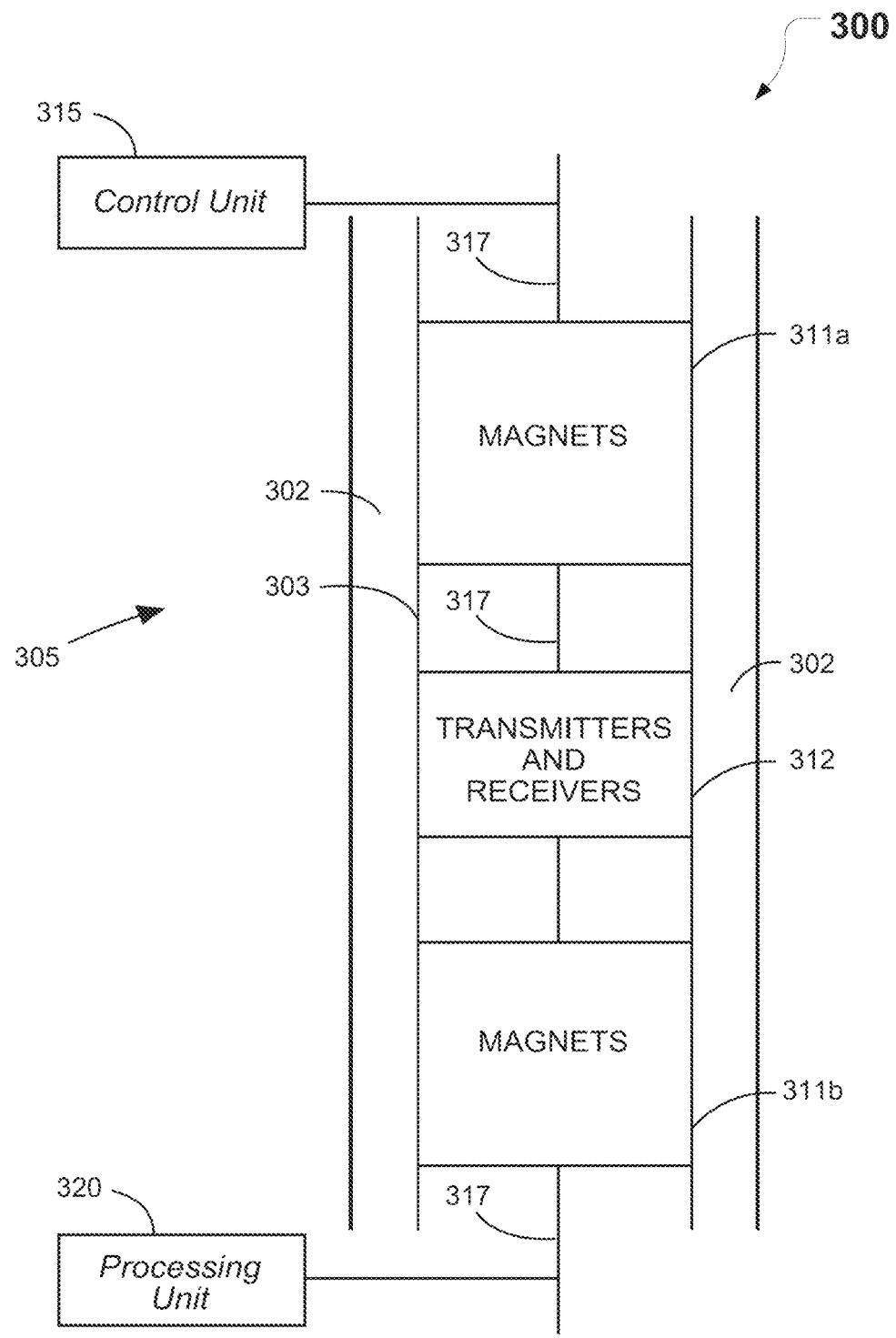
FIG. 3 is a block diagram of an illustrative NMR logging system for collecting NMR measurements of a subsurface rock formation.

FIG. 3 is a block diagram of an illustrative NMR logging system 300 in which an NMR logging tool, e.g., NMR logging tools 132 and 232 of FIGS. 1 and 2, respectively, as described above, may be implemented. For purposes of illustration, system 300 is shown in FIG. 3 with an NMR logging tool 305 operable in a wellbore 302 for collecting NMR measurements from different regions (or "zones") of a surrounding reservoir rock formation. In one or more embodiments, the different formation regions/zones may include water zones comprising water-saturated rock and at least one oil zone comprising rock saturated with a multiphase fluid. The multiphase fluid may be 100% hydrocarbon (e.g., oil and/or natural gas) or some combination of hydrocarbon and water.

As shown in FIG. 3, NMR logging tool 305 may have a housing 303 that includes an arrangement of magnets 311a and 311b ("magnets 311a-b") along with an array of transmitters and receivers 312. Transmitter-receiver array 312 may be implemented as, for example, a single transceiver unit having an antenna structure with separate transmitter and receiver components, e.g., one or more tilted transmitter coils and one or more tilted receiver coils. The transmitter coil(s) may be configured to transmit NMR pulse sequences that propagate through the surrounding rock formation. The receiver coil(s) may be configured to receive NMR signals produced in response the transmitted signal(s). It should be appreciated that the transmitter and receiver coils may be positioned in any of various orientations and tilt angles as desired for a particular implementation. The transmitters and receivers in transmitter-receiver array 312 may be arranged in relation to, for example and without limitation, a longitudinal axis 317 of the tool housing 303.

A control unit 315 may be used to control or manage the generation and collection of signals by the respective transmitters and receivers in transmitter-receiver array 312. The generated signals may include, for example, numerous T2 echo train sequences for investigating different regions/zones of the reservoir rock formation along wellbore 302. Each echo train sequence in this example may include a tipping pulse, a sequence of refocusing pulses, an end refocusing pulse, and a recovery pulse added after the last refocusing pulse in the sequence. These pulses may include a 90-degree tipping pulse, 180-degree refocusing pulses, and a 90-degree recovery pulse. Control unit 315 may cause transmitter-receiver array 312 to selectively generate tipping, refocusing, and recovery pulses at other orientations.

A processing unit 320 may process NMR signals received from the different regions/zones of the reservoir rock formation in response to the pulse sequence generated by transmitter-receiver array 312. While control unit 315 and processing unit 320 are shown outside of housing 303, it should be appreciated that control unit 315 and processing unit 320 may be implemented as integrated components within housing 303 of NMR logging tool 305. Alternatively, control unit 315 and processing unit 320 may be implemented as distributed components that may be housed at the surface of the wellsite or downhole. Thus, control unit 315 and processing unit 320 in some implementations may be separate downhole components attached to a drill string (e.g., drill string 108 of FIG. 1, as described above) or included within a BHA thereof. In other implementations, one or both of control unit 315 and processing unit 320 may be implemented as part of a computing device located at the surface of the wellsite. For example, control unit 315 may be implemented downhole while processing unit 320 may be implemented using a surface computing device, e.g., computer 144 of FIG. 1 or computer 244 of FIG. 2, as described above. Such a computing device may be any type of computer having at least one processor and a memory. The memory may be in the form of a processor-readable storage medium for storing data and instructions executable by the processor. Examples of such a computing device include, but are not limited to, a tablet computer, a laptop computer, a desktop computer, a workstation, a server, a cluster of computers in a server farm or other type of computing device.

In one or more embodiments, processing unit 320 may apply the NMR logging measurements collected by the NMR logging tool 305 as input to an ML model for performing NMR fluid substitution. It should be appreciated that any of various types of ML models may be used as desired for a particular implementation. In one or more embodiments, the ML model may be a deep neural network having an input layer, at least two hidden layers, and an output layer. An example of such an ML-based NMR fluid substitution model is shown in FIG. 4.

Figure 4:
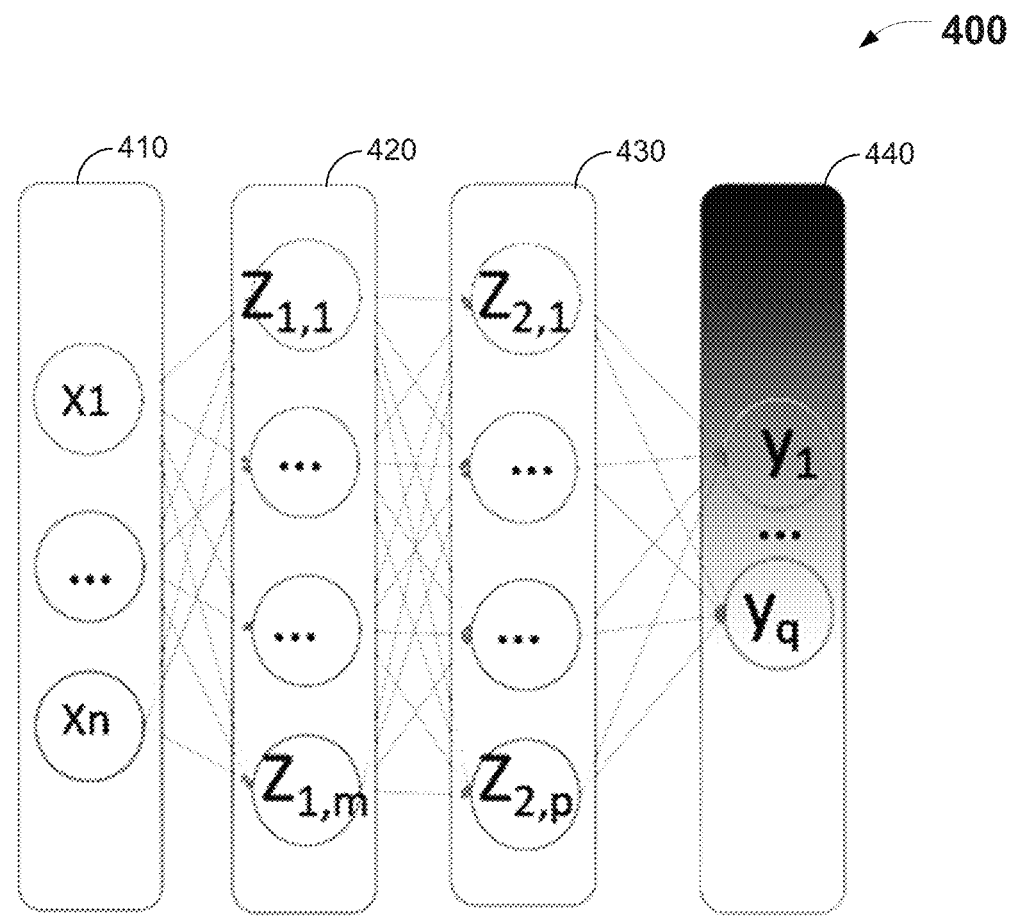
FIG. 4 is a diagram of an illustrative machine learning model for NMR fluid substitution.

In FIG. 4, an ML model 400 includes an input layer 410, a hidden layer 420, a hidden layer 430, and an output layer 440. Although only hidden layers 420 and 430 are shown in FIG. 4, it should be appreciated that embodiments are not intended to be limited thereto and that any number of hidden layers may be used as desired for a particular implementation. In contrast with some conventional NMR fluid substitution models, ML model 400 may be calibrated or trained using NMR logging data acquired for a reservoir rock formation by an NMR logging tool, such as those described above with respect to FIGS. 1-3, without requiring additional core and fluid analysis, e.g., based on laboratory measurements of core and fluid samples obtained from the formation.

As shown in FIG. 4, input layer 410 of ML model 400 includes a plurality of input nodes corresponding to a set of inputs $X_1, \ldots X_n$, where "n" may be any integer value. Likewise, hidden layer 420 includes a set of hidden nodes corresponding to elements $Z_{1,1} \ldots Z_{1,m}$, where "m" may be any integer value. The nodes of hidden layer 420 may use the inputs from input layer 410 to perform calculations of the corresponding $Z_1$ elements, e.g., as expressed by Equation (1):

$$Z_{1,i} = f(W1,i * X + b1,i) \text{ for } i=1, \ldots, m \qquad (1),$$

where f is an activation function of hidden layer 420 and $W_1$ and $b_1$ are parameters of hidden layer 420, which may be learned through training of ML model 400. The inputs from input layer 410 may be provided as, for example, a vector of input elements. It should be appreciated that individual nodes of a layer of ML model 400 may be coupled to one or more of the nodes of an adjacent layer. For example, each node of hidden layer 420 may be coupled to one or any number (including all) of the input nodes of input layer 410.

The $Z_1$ elements resulting from the calculations performed by the nodes of hidden layer 420 (e.g., a vector of $Z_1$ elements calculated by hidden layer 420) may then be provided as inputs to nodes of hidden layer 430 for calculating a set of corresponding elements $Z_{2,1}, \ldots Z_{2,p}$, where "p" may be any integer value, e.g., as expressed by Equation (2):

$$Z_{2,i} = f(W2,i * Z1,i + b2,i) \text{ for } i=1, \ldots, p \qquad (2),$$

where f is an activation function of hidden layer 430 and $W_2$ and $b_2$ are parameters of hidden layer 430, which may be learned through training of ML model 400.

The results of the calculations within hidden layer 430 (e.g., a vector of $Z_2$ elements calculated by hidden layer 430) may be provided to output layer 440. Output layer 440 may include a set of output nodes that use the calculation results from hidden layer 430 to produce a set of outputs $Y_1, \ldots Y_q$, where "q" may be any integer value. The calculations performed by the nodes of output layer 440 may be expressed by, for example, Equation (3):

$$Y_i = f(W3, i*Z2, i + b_3, i) \text{ for } i=1, \ldots, q \quad (3),$$

where f is an activation function of output layer 440 and $W_3$ and $b_3$ are parameters of output layer 440, which may be learned through training of ML model 400.

Thus, by combining Equations (1)-(3) above, ML model 400 may be expressed using Equation (4):

$$Y = f(W_{3,i} * f(W_{2,i} * f(W_{1,i} * X + b_{1,i}) + b_{2,i}) + b_{3,i}) \quad (4).$$

The main component of the inputs to ML model 400 may be T2 distributions of multiphase fluids, i.e., hydrocarbon (oil and/or natural gas) and water, while the outputs of ML model 400 may be T2 distributions of 100% water saturation. A loss function for ML model 400 may be based on root mean square error.

In addition to the T2 distributions of multiphase fluids, the inputs to ML model 400 may include mineralogy and lithology logging measurements as well as total porosity and water saturation. The mineralogy and lithology logging measurements may include, for example and without limitation, gamma elemental analysis data, spectral gamma ray data, natural gamma ray data, resistivity data, induction data, acoustic, density data, photoelectric factor (PE) data, spontaneous potential (SP) data, neutron data, acoustic data. It should be appreciated that any of various downhole tools, sensors, or measurement devices may be used to acquire such measurements for a reservoir rock formation under investigation or analysis.

In one or more embodiments, a synthetic training dataset may be generated for training ML model 400 to perform fluid substitution on NMR logging data. As actual core logging data, which is generally used to develop and validate many petrophysical interpolation models, may be limited in quantity (and expensive to acquire from the field), the synthetic data may be used to increase the amount and quality of the training data for ML model 400. For example, a relatively large amount of synthetic data may be generated to make ML model 400 more robust. Furthermore, the synthetic data may be combined with core data for training ML model 400. In some implementations, data analytic techniques, such as over weighing core samples in the ML training process, may be used to correct any bias introduced by the synthetic data. The synthetic data may also be validated using the available core data during the training process.

In one or more embodiments, the NMR logging measurements used to generate the synthetic training dataset are acquired for water zones of the reservoir rock formation. Water zones may be regions of the formation with 100% water-saturated rock. Such formation regions may surround sections of a wellbore drilled into the formation, along which the corresponding NMR logging measurements may be acquired by an NMR logging tool, e.g., any of NMR logging tools 132, 232, and 305 of FIGS. 1-3, respectively, as described above.

In one or more embodiments, the water zones for which the NMR logging measurements are acquired have the same or similar petrophysical characteristics as at least one oil (or multiphase) zone of interest for purposes of fluid substitutions. In other words, to use NMR logging measurements of a water zone, the lithology and mineralogy of the water zone should be the same or similar as that of the oil zone. Such water zones may be along the same well as the oil zone, along one or more nearby wells, or any wells in the same field as the well associated with the oil zone. The petrophysical characteristics of a formation's fluid zones (including the multiple water zones and the at least one oil zone in this example) may be determined from the mineralogy and lithology logging measurements acquired for the formation, as described above. The mineralogy and lithology parameters used to train ML model 400 in this example may also define its scope of applicability. In other words, the applicability of ML model 400 for fluid substitution may be dependent upon the mineralogy and lithology measurements used to derive its training data. Thus, ML model 400 may be applied to an oil zone having petrophysical characteristics that are the same as or similar to the petrophysical characteristics of the water zones on which ML model 400 is trained.

In one or more embodiments, the synthetic dataset used to train ML model 400 may be generated by simulating the process of hydrocarbon displacing water in pore spaces within a reservoir rock formation under investigation. To ensure the synthetic T2 distributions are a faithful reconstruction of actual T2 distributions for multiphase fluids, the following three assumptions may be made: (1) water is the wetting phase, and hydrocarbon is the non-wetting phase; (2) hydrocarbon displaces water in larger pore spaces first; and (3) hydrocarbon does not displace water in pore spaces with bounded fluids. It may also be assumed that the displacement of water by hydrocarbons within the reservoir rock formation may produce formation regions in which the corresponding rock is water-wet but its pore spaces are totally (100%) occupied by hydrocarbon as well as regions of water-wet rock with pore spaces that are only partially occupied by hydrocarbon.

For purposes of the simulation, the expression $\{C_{i,o,w}\}_{i=1}^{N}$ may be used to represent the amplitudes of at least two fluid phases, e.g., oil (o) and water (w), in the T2 distribution, where N is the total number of pore sizes and i is the $i^{th}$ pore size. The expression $\{C_{i,w}\}_{i=1}^{N}$ may represent the amplitudes of a single phase (e.g., water) in the T2 distribution as well as the corresponding porosities of different pore sizes, where w denotes the pore spaces occupied by 100% water. Further, the inputs to ML model 400 may be expressed by Equation (5):

$$X = (GR, Vp, Vs, \emptyset, Sw, \{C_{i,o,w}\}_{i=1}^{N}) \quad (5),$$

where $\emptyset$ is total porosity, $S_w$ is water saturation, R is resistivity, Vp and Vs are acoustic data, GR is gamma data. The total porosity $\emptyset$ may be calculated as follows: $\emptyset = \Sigma_{i=1}^{N} C_{i,w}$. The outputs of ML model 400 may be expressed by Equation (6):

$$Y = \{C_{i,w}\}_{i=1}^{N} \quad (6).$$

The expression $\{T_{2,i,w}\}_{i=1}^{N}$ may be used to represent the T2 distributions of water in an area of the formation having a pore size (denoted by the index i) and whose pore spaces are 100% occupied by water. For cases of water displacement that produce water-wet rock with pore spaces occupied by 100% hydrocarbon, an NMR time domain response E(t) may be simulated based on Equation (7):

$$E(t) = \sum_{i=1}^{M} C_{i,w} e^{-\frac{t}{T_{2,i,w}}} + \phi(1 - S_w)e^{-\frac{t}{T_{2,o}}}, \quad (7)$$

where $S_W$ is the water saturation, and $T_{2,o}$ is the T2 of hydrocarbon, M is the number pore sizes still occupied by 100% water, and $\Sigma_{i=1}^{M} C_{i,w} = \emptyset S_w$, M<N. The T2 distribution of multiphase (water and hydrocarbon) may be obtained by applying NMR inversion on the NMR time domain response based on Equation (7) above.

The displacement of water by hydrocarbon in a pore space may be simulated based in part on Equation (8):

$$\frac{1}{T_{2,i,w}} = \rho \frac{S}{V} + \frac{1}{T_{2,bw}}, \quad (8)$$

where $\rho$ is the surface relaxivity of the $i^{th}$ pore size, S is the surface area of the pore, V is the pore volume, and $T_{2,bw}$ is the T2 of bulk water. The T2 of the water in the $i^{th}$ pore size may be determined using Equation (9):

$$\frac{1}{T'_{2,i,w}} = \rho \frac{S}{Vf_i} + \frac{1}{T_{2,bw}}, \quad (9)$$

where $T_{2,i,w}'$ is the T2 of water after hydrocarbon partially occupied the pore space, $f_i$ is the fraction of pore space occupied by water at the $i^{th}$ pore size, V is the pore volume, and $f_i V$ is the pore volume occupied by the water at the pore size.

Equations (8) and (9) may be combined as Equation (10):

$$\frac{1}{T'_{2,i,w}} = \frac{1}{f_i} * \frac{1}{T_{2,i,w}} + \left(1 - \frac{1}{f_i}\right)\frac{1}{T_{2,bw}}. \quad (10)$$

Hence, the NMR response E(t) for cases of water/hydrocarbon displacement in water-wet rock with pore spaces only partially occupied by hydrocarbon may be simulated based on Equation (11):

$$E(t) = \sum_{i=1}^{M1} C_{i,w} e^{-\frac{t}{T_{2,i,w}}} + \sum_{i=M1+1}^{M2} C_{i,w} * f_i * e^{-\frac{t}{T'_{2,i,w}}} + \phi(1 - S_w)e^{-\frac{t}{T_{2,o}}}, \quad (11)$$

where M1 is the number of pore sizes still 100% occupied by water and M1+1 to M2 are the pore sizes partially occupied by hydrocarbon. The multiphase T2 distribution may be determined by applying an NMR inversion to the simulated NMR time domain response based on Equation (11).

Accordingly, the synthetic training dataset for ML model 400 may include T2 distributions of multiphase fluids derived by simulating NMR responses after hydrocarbon displaces water in the pore spaces, based on Equation (7) or Equation (11), as well as the corresponding T2 distributions of 100% water saturation before hydrocarbon displacement occurs.

The T2 of hydrocarbon, represented by $T_{2,o}$ in Equations (7) and (11), may be available from laboratory data or deduced from its viscosity based on, for example, Equation (12), also referred to as the Vinegar equation:

$$T_{2,o}^{-1} = \frac{1200\eta}{T}, \quad (12)$$

where $\eta$ is the oil viscosity and T is the absolute temperature.

In one or more embodiments, the water saturation $S_w$ in Equations (7) and (11) above may be obtained from NMR fluid typing measurements, for example, using an inversion-forward-modeling-inversion (IFMI) technique for fluid typing for more accurate hydrocarbon volume estimation relative to other conventional techniques that use cutoffs or data analytics on the NMR T2 distribution.

The value of $f_i$, which is described above as the fraction of pore space occupied by water at the $i^{th}$ pore size, may represent the occupation rate in Equations (7) and (11). In one or more embodiments, the occupation rate $f_i$ in Equation (11), for example, may be determined using any of various well-known modeling techniques for different pore spaces. For example, the occupation rate for a spherical pore space may be determined using Equation (13):

$$f_i(T_2) = \begin{cases} 1 & T_2 < T_{2c} \\ \frac{r_p(T_2)^3 - (r_p(T_2) - \lambda)^3}{r_p(T_2)^3} & T_2 > T_{2c} \end{cases}, \quad (13)$$

where $$T_{2c} = \frac{r_{pc}}{\rho}$$

is a T2 cutoff value, p is the relaxivity of the pore surface, $r_p(T_2)$ is the pore radius, $$r_{pc} = \frac{2\sigma}{P_c}$$

(where $\sigma$ is me interracial tension and Pc is the capillary pressure), and $\lambda$ represents thin water layers of constant thickness.

Alternatively, the occupation rate $f_i$ may be determined through core NMR data. For example, core NMR data including a measurement of a 100% brine saturated core sample may be acquired. An additional NMR measurement of the core sample may be acquired after it has been desaturated to a saturation corresponding to irreducible water. The occupation rate $f_i$ may be derived based on a ratio of the two measurements.

As described above, ML model 400 may be trained for fluid substitution based on synthetic data generated from simulating NMR responses to multiphase fluids resulting from a displacement of water by hydrocarbon in the selected water zones of the reservoir rock formation. Alternatively, ML model 400 may be trained using partial water T2 distributions derived from a core analysis of rocks (e.g., core plugs). The partial water T2 distributions may be the water phases of the total T2 distributions with different percentages of water saturation. T2 distributions of core plugs may be obtained by first saturating the core plugs with water to obtain the T2 distributions of 100% water saturation. The core plugs may then be centrifuged with a perfluorinated fluid (e.g., HT-230 heat transfer fluid) or other non-wetting, non-proton containing fluid to generate partial water T2 distributions of various saturations. These partially saturated water T2 distributions may then be applied along with mineralogy and lithology parameters of the core plugs to train ML model 400 and define its the scope of applicability with respect to oil zones having the same or similar petrophysical characteristics. Mineralogy and lithology parameters of the core plug may be determined through core analysis measurements or estimated from mineralogy and lithology logging measurements, as described above, at formation depths where core plugs were acquired.

Thus, the inputs to ML model 400 may include mineralogy and lithology logging measurements, total porosity and water saturation, and partial water T2 distributions (instead of the T2 distributions of multiphase fluids, as described above). The outputs of ML model 400 with this alternative set of inputs are still the T2 distributions of a single fluid (100% water) with the same root mean square error loss function.

Hence, to apply the trained ML model in this alternative example to an oil zone of interest, the T2 distributions of multiphases may need to be decomposed into the T2 distribution of water phase and the T2 distribution of oil phase. The decomposition of T2 distributions of multiphases may be done, for example, through a cutoff method. The trained ML model in this alternative example may then be applied to the partial water distribution to predict T2 distribution of 100% water saturation.

As the amount of core data available for use in this alternative example may be very limited and the performance of ML model 400 may depend on the amount of training data that is available, one or more data augmentation techniques, e.g., the Synthetic Minority Oversampling Technique (SMOTE), may be used to synthesize new training data from the existing data. However, commonly used data augmentation techniques, such as SMOTE, do not maintain the underlying physical links between the partial water T2 distributions and their corresponding fully saturated T2 distributions.

Thus, in one example, the core data may be augmented by forward modeling NMR responses based on the partially saturated water T2 distributions and the corresponding fully saturated T2 distributions of core plugs with various Gaussian noises. NMR inversion may then be applied to the generated NMR responses to create partially saturated T2 distributions and the corresponding fully saturated T2 distributions.

In another example, the core data may be augmented by changing the total porosities of the partially saturated T2 distributions and the corresponding fully saturated T2 distributions of core plugs. The total porosities of these T2 distributions are changed to have the same value and thereby maintain the physical links between partially saturated T2 distributions and fully saturated T2 distributions.

Figure 5:
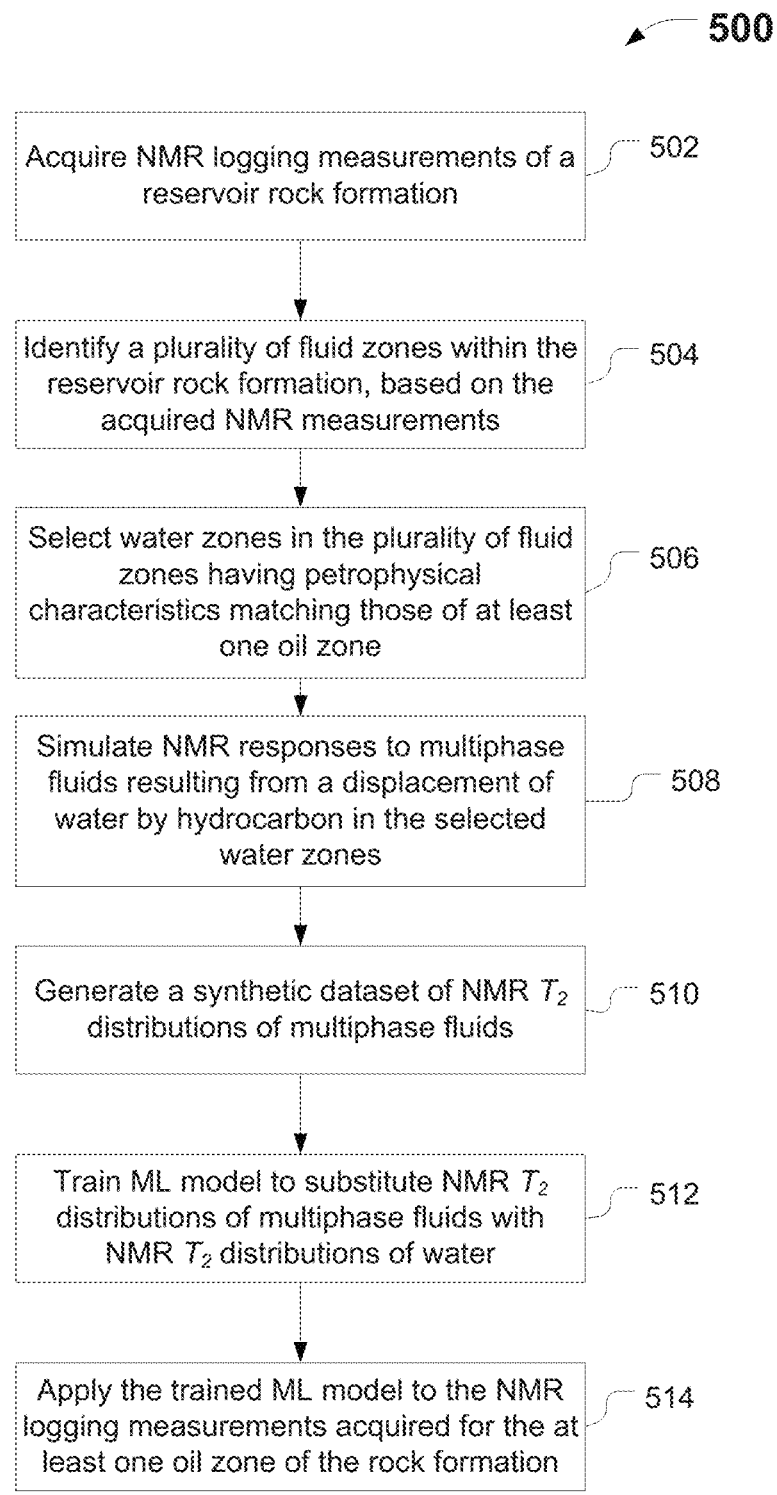
FIG. 5 is a flowchart of an illustrative process for NMR fluid substitution using machine learning.

FIG. 5 is a flowchart of an illustrative process 500 for NMR fluid substitution using machine learning. For discussion purposes, process 500 will be described with reference to the drilling and logging systems of FIGS. 1-3, as described above. For example, process 500 may be performed by processing unit 320 of system 300, e.g., as part of computer 144 of FIG. 1 or computer 244 of FIG. 2, located at the surface of a wellsite, as described above. However, process 500 is not intended to be limited thereto.

As shown in FIG. 5, process 500 begins in block 502, which includes acquiring NMR logging measurements of a reservoir rock formation.

Process 500 then proceeds to block 504, which includes identifying a plurality of fluid zones within the reservoir rock formation, based on the acquired NMR logging measurements. The plurality of fluid zones may include water zones comprising water-saturated rock and at least one oil zone comprising rock saturated with multiphase fluids. The multiphase fluids may be 100% hydrocarbon (oil or natural gas) or a mixture of hydrocarbon and water.

Process 500 then proceeds to block 506, which includes selecting water zones in the plurality of fluid zones of the reservoir rock formation having petrophysical characteristics matching those of the oil zone(s) within the reservoir rock formation.

In block 508, NMR responses to multiphase fluids resulting from a displacement of water by hydrocarbon in the selected water zones are simulated, based on the corresponding NMR logging measurements and petrophysical characteristics of the selected water zones.

In block 510, a synthetic dataset of NMR T2 distributions of multiphase fluids within the reservoir rock formation is generated, based on the simulated NMR responses.

The synthetic dataset generated in block 510 is then used in block 512 to train a machine learning (ML) model to substitute NMR T2 distributions of multiphase fluids with NMR T2 distributions of water.

In block 514, the trained ML model is applied to the NMR logging measurements acquired for the oil zone(s) of the reservoir rock formation to estimate or predict corresponding T2 distributions of 100% water saturation. The estimated T2 distributions of 100% water saturation may be used, for example, to replace the T2 distributions of multiphase fluids in the oil zone(s) of the reservoir rock formation.

In one or more embodiments, a petrophysical model of the reservoir rock formation may be generated based on the NMR T2 distributions substituted by the trained ML model. The petrophysical model may then be used to determine rock properties of the oil zone(s) within the reservoir rock formation. Hydrocarbon recovery operations, including hydrocarbon exploration and production operations, may then be performed based on the determined rock properties.

Figure 6:
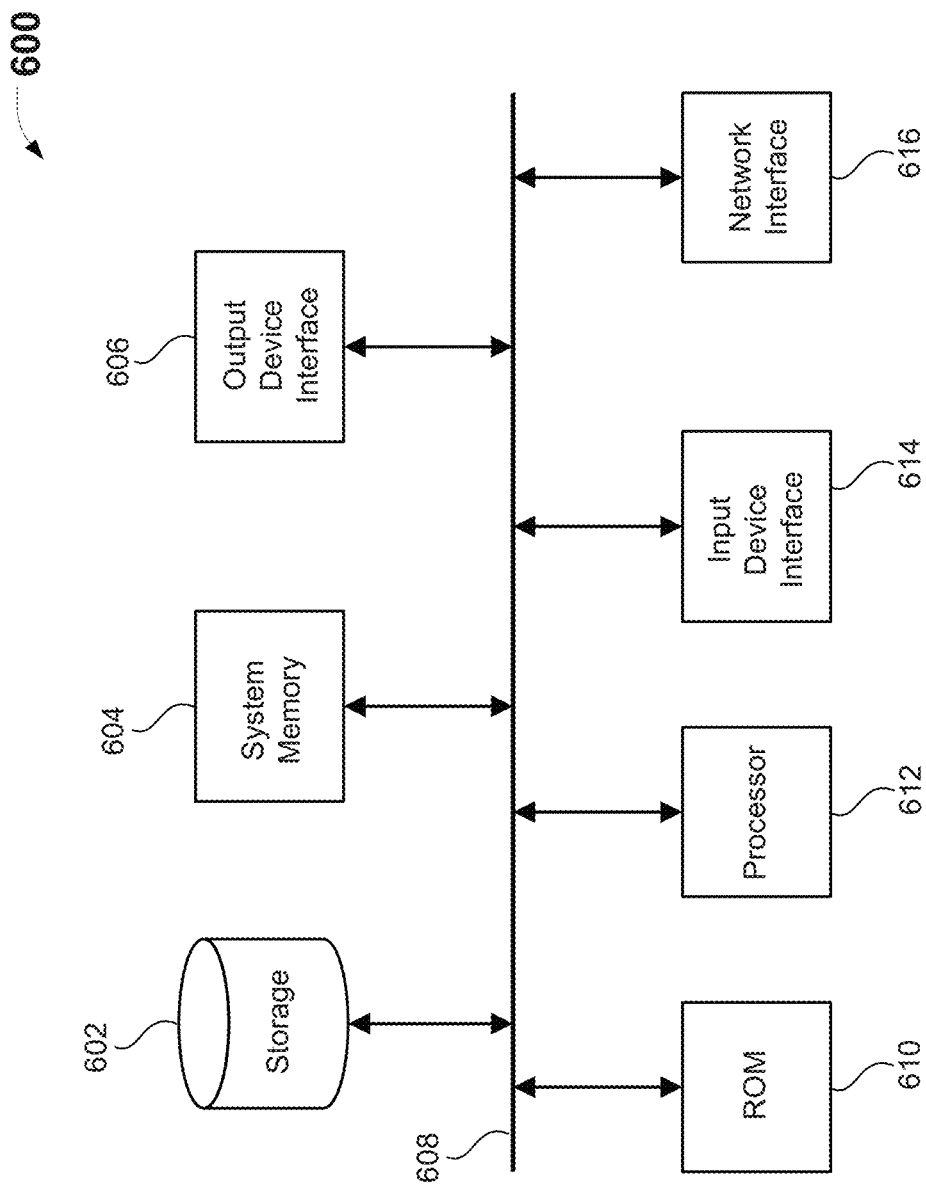
FIG. 6 is a block diagram of an illustrative computer system in which embodiments of the present disclosure may be implemented.

FIG. 6 is a block diagram of an illustrative computer system 600 in which embodiments of the present disclosure may be implemented. For example, computers 144 and 244 of FIGS. 1 and 2, respectively, and processing unit 320 of FIG. 3, as described above, may be implemented using system 600. Additionally, the operations corresponding to the steps of process 500 of FIG. 5, as described above, may also be implemented using system 600. System 600 can be a computer, phone, PDA, or any other type of electronic device. Such an electronic device includes various types of computer readable media and interfaces for various other types of computer readable media. As shown in FIG. 6, system 600 includes a permanent storage device 602, a system memory 604, an output device interface 606, a system communications bus 608, a read-only memory (ROM) 610, processing unit(s) 612, an input device interface 614, and a network interface 616.

Bus 608 collectively represents all system, peripheral, and chipset buses that communicatively connect the numerous internal devices of system 600. For instance, bus 608 communicatively connects processing unit(s) 612 with ROM 610, system memory 604, and permanent storage device 602.

From these various memory units, processing unit(s) 612 retrieves instructions to execute and data to process in order to execute the processes of the subject disclosure. The processing unit(s) can be a single processor or a multi-core processor in different implementations.

ROM 610 stores static data and instructions that are needed by processing unit(s) 612 and other modules of system 600. Permanent storage device 602, on the other hand, is a read-and-write memory device. This device is a non-volatile memory unit that stores instructions and data even when system 600 is off. Some implementations of the subject disclosure use a mass-storage device (such as a magnetic or optical disk and its corresponding disk drive) as permanent storage device 602.

Other implementations use a removable storage device (such as a floppy disk, flash drive, and its corresponding disk drive) as permanent storage device 602. Like permanent storage device 602, system memory 604 is a read-and-write memory device. However, unlike storage device 602, system memory 604 is a volatile read-and-write memory, such a random access memory. System memory 604 stores some of the instructions and data that the processor needs at runtime. In some implementations, the processes of the subject disclosure are stored in system memory 604, permanent storage device 602, and/or ROM 610. For example, the various memory units include instructions for computer aided pipe string design based on existing string designs in accordance with some implementations. From these various memory units, processing unit(s) 612 retrieves instructions to execute and data to process in order to execute the processes of some implementations.

Bus 608 also connects to input and output device interfaces 614 and 606. Input device interface 614 enables the user to communicate information and select commands to the system 600. Input devices used with input device interface 614 include, for example, alphanumeric, QWERTY, or T9 keyboards, microphones, and pointing devices (also called "cursor control devices"). Output device interfaces 606 enables, for example, the display of images generated by the system 600. Output devices used with output device interface 606 include, for example, printers and display devices, such as cathode ray tubes (CRT) or liquid crystal displays (LCD). Some implementations include devices such as a touchscreen that functions as both input and output devices. It should be appreciated that embodiments of the present disclosure may be implemented using a computer including any of various types of input and output devices for enabling interaction with a user. Such interaction may include feedback to or from the user in different forms of sensory feedback including, but not limited to, visual feedback, auditory feedback, or tactile feedback. Further, input from the user can be received in any form including, but not limited to, acoustic, speech, or tactile input. Additionally, interaction with the user may include transmitting and receiving different types of information, e.g., in the form of documents, to and from the user via the above-described interfaces.

Also, as shown in FIG. 6, bus 608 also couples system 600 to a public or private network (not shown) or combination of networks through a network interface 616. Such a network may include, for example, a local area network ("LAN"), such as an Intranet, or a wide area network ("WAN"), such as the Internet. Any or all components of system 600 can be used in conjunction with the subject disclosure.

These functions described above can be implemented in digital electronic circuitry, in computer software, firmware or hardware. The disclosed techniques may be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra-density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself. Accordingly, instructions for performing process 500 of FIG. 5, as described above, may be implemented using system 600 or any computer system having processing circuitry or a computer program product including instructions stored therein, which, when executed by at least one processor, causes the processor to perform functions relating to these methods.

As used in this specification and any claims of this application, the terms "computer", "server", "processor", and "memory" all refer to electronic or other technological devices. These terms exclude people or groups of people. As used herein, the terms "computer readable medium" and "computer readable media" refer generally to tangible, physical, and non-transitory electronic storage mediums that store information in a form that is readable by a computer.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., a web page) to a client device (e.g., for purposes of displaying data to and receiving user input from a user interacting with the client device). Data generated at the client device (e.g., a result of the user interaction) can be received from the client device at the server.

It is understood that any specific order or hierarchy of steps in the processes disclosed is an illustration of exemplary approaches. Based upon design preferences, it is understood that the specific order or hierarchy of steps in the processes may be rearranged, or that all illustrated steps be performed. Some of the steps may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Furthermore, the exemplary methodologies described herein may be implemented by a system including processing circuitry or a computer program product including instructions which, when executed by at least one processor, causes the processor to perform any of the methodology described herein.

As described above, embodiments of the present disclosure are particularly useful for performing NMR fluid substitution. Accordingly, advantages of the present disclosure include providing an NMR fluid substitution model that may be calibrated and used to perform NMR fluid substitution without requiring additional core and fluid analyses to be conducted as in conventional modeling approaches for NMR fluid substitution.

As described above, a computer-implemented method of nuclear magnetic resonance (NMR) fluid substitution has been described. Embodiments of the method may include: acquiring, by a computing device, NMR logging measurements of a reservoir rock formation; identifying a plurality of fluid zones within the reservoir rock formation, based on the acquired NMR logging measurements, the plurality of fluid zones including water zones comprising water-saturated rock and at least one oil zone comprising rock saturated with multiphase fluids, the multiphase fluids including at least one of a hydrocarbon or a mixture of hydrocarbon and water; selecting water zones in the plurality of fluid zones having petrophysical characteristics matching those of the at least one oil zone within the reservoir rock formation; simulating NMR responses to multiphase fluids resulting from a displacement of water by hydrocarbon in the selected water zones of the reservoir rock formation, based on the corresponding NMR logging measurements and petrophysical characteristics of the selected water zones; generating a synthetic dataset including NMR T2 distributions of multiphase fluids within the reservoir rock formation, based on the simulated NMR responses; training a machine learning (ML) model to substitute NMR T2 distributions of multiphase fluids with NMR T2 distributions of water, based on the generated synthetic dataset; and applying the trained ML model to the NMR logging measurements acquired for the at least one oil zone of the reservoir rock formation.

Likewise, embodiments of a computer-readable storage medium having instructions stored therein have been described, where the instructions, when executed by a computer, may cause the computer to perform a plurality of functions, including functions to: acquire NMR logging measurements of a reservoir rock formation; identify a plurality of fluid zones within the reservoir rock formation, based on the acquired NMR logging measurements, the plurality of fluid zones including water zones comprising water-saturated rock and at least one oil zone comprising rock saturated with multiphase fluids, the multiphase fluids including at least one of a hydrocarbon or a mixture of hydrocarbon and water; select water zones in the plurality of fluid zones having petrophysical characteristics matching those of the at least one oil zone within the reservoir rock formation; simulate NMR responses to multiphase fluids resulting from a displacement of water by hydrocarbon in the selected water zones of the reservoir rock formation, based on the corresponding NMR logging measurements and petrophysical characteristics of the selected water zones; generate a synthetic dataset including NMR T2 distributions of multiphase fluids within the reservoir rock formation, based on the simulated NMR responses; train a machine learning (ML) model to substitute NMR T2 distributions of multiphase fluids with NMR T2 distributions of water, based on the generated synthetic dataset; and apply the trained ML model to the NMR logging measurements acquired for the at least one oil zone of the reservoir rock formation.

The foregoing embodiments of the method or computer-readable storage medium may include any one or any combination of the following elements, features, functions, or operations: the NMR logging measurements are acquired from an NMR logging tool disposed within a wellbore drilled within the reservoir rock formation or an offset wellbore located near the wellbore; the at least one oil zone is located along a first wellbore drilled within the reservoir rock formation at a first wellsite in a hydrocarbon producing field, the water zones are located along one or more second wellbores drilled within the reservoir rock formation at corresponding wellsites within the hydrocarbon producing field, and the NMR measurements are acquired from NMR logging tools disposed within the respective first and second wellbores; generating a petrophysical model of the reservoir rock formation based on the NMR T2 distributions substituted by the trained ML model; and determining rock properties of the at least one oil zone within the reservoir rock formation, based on the generated petrophysical model, wherein hydrocarbon recovery operations are performed based on the determined rock properties; determining the petrophysical characteristics of each fluid zone in the plurality of fluid zones, based on mineralogy and lithology logging data acquired for that fluid zone; the petrophysical characteristics include a total porosity and a water saturation; the mineralogy and lithology logging data are selected from the group consisting of gamma elemental analysis data, spectral gamma ray data, natural gamma ray data, resistivity data, induction data, acoustic data, density data, photoelectric factor (PE) data, spontaneous potential (SP) data, neutron data, and downhole image logs.

Also, embodiments of a system including at least one processor and a memory coupled to the processor have been described, where the memory stores instructions, which, when executed by a processor, may cause the processor(s) to perform a plurality of functions, including functions to: acquire NMR logging measurements of a reservoir rock formation; identify a plurality of fluid zones within the reservoir rock formation, based on the acquired NMR logging measurements, the plurality of fluid zones including water zones comprising water-saturated rock and at least one oil zone comprising rock saturated with multiphase fluids, the multiphase fluids including at least one of a hydrocarbon or a mixture of hydrocarbon and water; select water zones in the plurality of fluid zones having petrophysical characteristics matching those of the at least one oil zone within the reservoir rock formation; simulate NMR responses to multiphase fluids resulting from a displacement of water by hydrocarbon in the selected water zones of the reservoir rock formation, based on the corresponding NMR logging measurements and petrophysical characteristics of the selected water zones; generate a synthetic dataset including NMR T2 distributions of multiphase fluids within the reservoir rock formation, based on the simulated NMR responses; train a machine learning (ML) model to substitute NMR T2 distributions of multiphase fluids with NMR T2 distributions of water, based on the generated synthetic dataset; and apply the trained ML model to the NMR logging measurements acquired for the at least one oil zone of the reservoir rock formation.

The foregoing embodiments of the system, the functions performed by the processor may include any one or any combination of the following elements, features, functions, or operations: the NMR logging measurements are acquired from an NMR logging tool disposed within a wellbore drilled within the reservoir rock formation or an offset wellbore located near the wellbore; the at least one oil zone is located along a first wellbore drilled within the reservoir rock formation at a first wellsite in a hydrocarbon producing field, the water zones are located along one or more second wellbores drilled within the reservoir rock formation at corresponding wellsites within the hydrocarbon producing field, and the NMR measurements are acquired from NMR logging tools disposed within the respective first and second wellbores; generating a petrophysical model of the reservoir rock formation based on the NMR T2 distributions substituted by the trained ML model; and determining rock properties of the at least one oil zone within the reservoir rock formation, based on the generated petrophysical model, wherein hydrocarbon recovery operations are performed based on the determined rock properties; determining the petrophysical characteristics of each fluid zone in the plurality of fluid zones, based on mineralogy and lithology logging data acquired for that fluid zone; the petrophysical characteristics include a total porosity and a water saturation; the mineralogy and lithology logging data are selected from the group consisting of gamma elemental analysis data, spectral gamma ray data, natural gamma ray data, resistivity data, induction data, acoustic data, density data, photoelectric factor (PE) data, spontaneous potential (SP) data, neutron data, and downhole image logs.

While specific details about the above embodiments have been described, the above hardware and software descriptions are intended merely as example embodiments and are not intended to limit the structure or implementation of the disclosed embodiments. For instance, although many other internal components of system 600 are not shown, those of ordinary skill in the art will appreciate that such components and their interconnection are well known.

In addition, certain aspects of the disclosed embodiments, as outlined above, may be embodied in software that is executed using one or more processing units/components. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives, optical or magnetic disks, and the like, which may provide storage at any time for the software programming.

Additionally, the flowchart and block diagrams in the figures illustrate the architecture, functionality, and operation of possible implementations of systems, methods and computer program products according to various embodiments of the present disclosure. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The above specific example embodiments are not intended to limit the scope of the claims. The example embodiments may be modified by including, excluding, or combining one or more features or functions described in the disclosure.

As used herein, the singular forms "a", "an" and "the" are intended to include the plural forms as well, unless the context clearly indicates otherwise. It will be further understood that the terms "comprise" and/or "comprising," when used in this specification and/or the claims, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and explanation but is not intended to be exhaustive or limited to the embodiments in the form disclosed. Many modifications and variations will be apparent to those of ordinary skill in the art without departing from the scope and spirit of the disclosure. The illustrative embodiments described herein are provided to explain the principles of the disclosure and the practical application thereof, and to enable others of ordinary skill in the art to understand that the disclosed embodiments may be modified as desired for a particular implementation or use. The scope of the claims is intended to broadly cover the disclosed embodiments and any such modification.

What is claimed is:

1. A computer-implemented method of nuclear magnetic resonance (NMR) fluid substitution, the method comprising:
    acquiring, by a computing device, NMR logging measurements of a reservoir rock formation;
    identifying a plurality of fluid zones within the reservoir rock formation, based on the acquired NMR logging measurements, the plurality of fluid zones including water zones comprising water-saturated rock and at least one oil zone comprising rock saturated with multiphase fluids, the multiphase fluids including at least one of a hydrocarbon or a mixture of hydrocarbon and water;

selecting water zones in the plurality of fluid zones having petrophysical characteristics matching those of the at least one oil zone within the reservoir rock formation;
simulating NMR responses to multiphase fluids resulting from a displacement of water by hydrocarbon in the selected water zones of the reservoir rock formation, based on the corresponding NMR logging measurements and petrophysical characteristics of the selected water zones;
generating a synthetic dataset including NMR T2 distributions of multiphase fluids within the reservoir rock formation, based on the simulated NMR responses;
training a machine learning (ML) model to substitute NMR T2 distributions of multiphase fluids with NMR T2 distributions of water, based on the generated synthetic dataset; and
applying the trained ML model to the NMR logging measurements acquired for the at least one oil zone of the reservoir rock formation.

2. The method of claim 1, wherein the NMR logging measurements are acquired from an NMR logging tool disposed within a wellbore drilled within the reservoir rock formation or an offset wellbore located near the wellbore.

3. The method of claim 1, wherein the at least one oil zone is located along a first wellbore drilled within the reservoir rock formation at a first wellsite in a hydrocarbon producing field, the water zones are located along one or more second wellbores drilled within the reservoir rock formation at corresponding wellsites within the hydrocarbon producing field, and the NMR measurements are acquired from NMR logging tools disposed within the respective first and second wellbores.

4. The method of claim 1, further comprising:
generating a petrophysical model of the reservoir rock formation based on the NMR T2 distributions substituted by the trained ML model; and
determining rock properties of the at least one oil zone within the reservoir rock formation, based on the generated petrophysical model,
wherein hydrocarbon recovery operations are performed based on the determined rock properties.

5. The method of claim 1, further comprising:
determining the petrophysical characteristics of each fluid zone in the plurality of fluid zones, based on mineralogy and lithology logging data acquired for that fluid zone.

6. The method of claim 5, wherein the petrophysical characteristics include a total porosity and a water saturation.

7. The method of claim 5, wherein the mineralogy and lithology logging data are selected from the group consisting of gamma elemental analysis data, spectral gamma ray data, natural gamma ray data, resistivity data, induction data, acoustic data, density data, photoelectric factor (PE) data, spontaneous potential (SP) data, neutron data, and downhole image logs.

8. A system comprising:
at least one processor; and
a memory coupled to the processor having instructions stored therein, which when executed by the processor, cause the processor to perform functions, including functions to:
acquire NMR logging measurements of a reservoir rock formation;
identify a plurality of fluid zones within the reservoir rock formation, based on the acquired NMR logging measurements, the plurality of fluid zones including water zones comprising water-saturated rock and at least one oil zone comprising rock saturated with multiphase fluids, the multiphase fluids including at least one of a hydrocarbon or a mixture of hydrocarbon and water;
select water zones in the plurality of fluid zones having petrophysical characteristics matching those of the at least one oil zone within the reservoir rock formation;
simulate NMR responses to multiphase fluids resulting from a displacement of water by hydrocarbon in the selected water zones of the reservoir rock formation, based on the corresponding NMR logging measurements and petrophysical characteristics of the selected water zones;
generate a synthetic dataset including NMR T2 distributions of multiphase fluids within the reservoir rock formation, based on the simulated NMR responses;
train a machine learning (ML) model to substitute NMR T2 distributions of multiphase fluids with NMR T2 distributions of water, based on the generated synthetic dataset; and
apply the trained ML model to the NMR logging measurements acquired for the at least one oil zone of the reservoir rock formation.

9. The system of claim 8, wherein the NMR logging measurements are acquired from an NMR logging tool disposed within a wellbore drilled within the reservoir rock formation or an offset wellbore located near the wellbore.

10. The system of claim 8, wherein the at least one oil zone is located along a first wellbore drilled within the reservoir rock formation at a first wellsite in a hydrocarbon producing field, the water zones are located along one or more second wellbores drilled within the reservoir rock formation at corresponding wellsites within the hydrocarbon producing field, and the NMR measurements are acquired from NMR logging tools disposed within the respective first and second wellbores.

11. The system of claim 8, wherein the functions performed by the at least one processor further include functions to:
generate a petrophysical model of the reservoir rock formation based on the NMR T2 distributions substituted by the trained ML model; and
determine rock properties of the at least one oil zone within the reservoir rock formation, based on the generated petrophysical model,
wherein hydrocarbon recovery operations are performed based on the determined rock properties.

12. The system of claim 8, wherein the functions performed by the at least one processor further include functions to:
determining the petrophysical characteristics of each fluid zone in the plurality of fluid zones, based on mineralogy and lithology logging data acquired for that fluid zone.

13. The system of claim 12, wherein the petrophysical characteristics include a total porosity and a water saturation.

14. The system of claim 12, wherein the mineralogy and lithology logging data are selected from the group consisting of gamma elemental analysis data, spectral gamma ray data, natural gamma ray data, resistivity data, induction data, acoustic data, density data, photoelectric factor (PE) data, spontaneous potential (SP) data, neutron data, and downhole image logs.

15. A computer-readable storage medium having instructions stored therein, which when executed by a computer cause the computer to perform a plurality of functions, including functions to:
- acquire NMR logging measurements of a reservoir rock formation;
- identify a plurality of fluid zones within the reservoir rock formation, based on the acquired NMR logging measurements, the plurality of fluid zones including water zones comprising water-saturated rock and at least one oil zone comprising rock saturated with multiphase fluids, the multiphase fluids including at least one of a hydrocarbon or a mixture of hydrocarbon and water;
- select water zones in the plurality of fluid zones having petrophysical characteristics matching those of the at least one oil zone within the reservoir rock formation;
- simulate NMR responses to multiphase fluids resulting from a displacement of water by hydrocarbon in the selected water zones of the reservoir rock formation, based on the corresponding NMR logging measurements and petrophysical characteristics of the selected water zones;
- generate a synthetic dataset including NMR T2 distributions of multiphase fluids within the reservoir rock formation, based on the simulated NMR responses;
- train a machine learning (ML) model to substitute NMR T2 distributions of multiphase fluids with NMR T2 distributions of water, based on the generated synthetic dataset; and
- apply the trained ML model to the NMR logging measurements acquired for the at least one oil zone of the reservoir rock formation.

16. The computer-readable storage medium of claim 15, wherein the NMR logging measurements are acquired from an NMR logging tool disposed within a wellbore drilled within the reservoir rock formation or an offset wellbore located near the wellbore.

17. The computer-readable storage medium of claim 15, wherein the at least one oil zone is located along a first wellbore drilled within the reservoir rock formation at a first wellsite in a hydrocarbon producing field, the water zones are located along one or more second wellbores drilled within the reservoir rock formation at corresponding wellsites within the hydrocarbon producing field, and the NMR measurements are acquired from NMR logging tools disposed within the respective first and second wellbores.

18. The computer-readable storage medium of claim 15, wherein the functions performed by the computer further include functions to:
- generating a petrophysical model of the reservoir rock formation based on the NMR T2 distributions substituted by the trained ML model; and
- determining rock properties of the at least one oil zone within the reservoir rock formation, based on the generated petrophysical model, wherein hydrocarbon recovery operations are performed based on the determined rock properties.

19. The computer-readable storage medium of claim 15, wherein the functions performed by the computer further include functions to determine the petrophysical characteristics of each fluid zone in the plurality of fluid zones, based on mineralogy and lithology logging data acquired for that fluid zone, wherein the petrophysical characteristics include a total porosity and a water saturation.

20. The computer-readable storage medium of claim 19, wherein the mineralogy and lithology logging data are selected from the group consisting of gamma elemental analysis data, spectral gamma ray data, natural gamma ray data, resistivity data, induction data, acoustic data, density data, photoelectric factor (PE) data, spontaneous potential (SP) data, neutron data, and downhole image logs.

* * * * *